US011152306B2

(12) United States Patent
Wu et al.

(10) Patent No.: US 11,152,306 B2
(45) Date of Patent: Oct. 19, 2021

(54) DIELECTRIC FILM FOR SEMICONDUCTOR FABRICATION

(71) Applicant: Taiwan Semiconductor Manufacturing Co., Ltd., Hsinchu (TW)

(72) Inventors: Cheng-Yi Wu, Taichung (TW); Li-Hsuan Chu, Taichung (TW); Ching-Wen Wen, Taichung (TW); Chia-Chun Hung, Taichung (TW); Chen Liang Chang, New Taipei (TW); Chin-Szu Lee, Taoyuan (TW); Hsiang Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/050,058

(22) Filed: Jul. 31, 2018

(65) Prior Publication Data

US 2018/0337128 A1 Nov. 22, 2018

Related U.S. Application Data

(62) Division of application No. 15/282,258, filed on Sep. 30, 2016.

(51) Int. Cl.
*H01L 23/48* (2006.01)
*H01L 23/532* (2006.01)
(Continued)

(52) U.S. Cl.
CPC ...... *H01L 23/5329* (2013.01); *H01L 21/0214* (2013.01); *H01L 21/0228* (2013.01);
(Continued)

(58) Field of Classification Search
CPC ............. H01L 23/5329; H01L 23/5283; H01L 23/53238; H01L 23/53223; H01L 27/14614; H01L 27/14663
See application file for complete search history.

(56) References Cited

U.S. PATENT DOCUMENTS 7,144,825 B2   12/2006   Adetutu et al.
7,964,422 B1   6/2011    Yee
(Continued)

FOREIGN PATENT DOCUMENTS

CN   101110386 A   1/2008
CN   101393862 A   3/2009
(Continued)

OTHER PUBLICATIONS

R. Colin Johnson "CMOS Image Sensors Surpassing Moore's Law. 3-D sensors quickly evolving from TSVs to Cu—Cu bonding," EE Times, Feb. 12, 2015, 9:36 AM EST, Portland, OR, 2 pages.

*Primary Examiner* — Hoa B Trinh
(74) *Attorney, Agent, or Firm* — Haynes and Boone, LLP

(57) ABSTRACT

A method for semiconductor manufacturing is disclosed. The method includes receiving a device having a first surface through which a first metal or an oxide of the first metal is exposed. The method further includes depositing a dielectric film having Si, N, C, and O over the first surface such that the dielectric film has a higher concentration of N and C in a first portion of the dielectric film near the first surface than in a second portion of the dielectric film further away from the first surface than the first portion. The method further includes forming a conductive feature over the dielectric film. The dielectric film electrically insulates the conductive feature from the first metal or the oxide of the first metal.

19 Claims, 7 Drawing Sheets

(51) Int. Cl.
*H01L 27/146* (2006.01)
*H01L 21/02* (2006.01)
*H01L 21/768* (2006.01)
*H01L 21/762* (2006.01)
*H01L 23/528* (2006.01)
*H01L 23/485* (2006.01)

(52) U.S. Cl.
CPC .. *H01L 21/02126* (2013.01); *H01L 21/02211* (2013.01); *H01L 21/02219* (2013.01); *H01L 21/02271* (2013.01); *H01L 21/76224* (2013.01); *H01L 21/76834* (2013.01); *H01L 21/76843* (2013.01); *H01L 21/76877* (2013.01); *H01L 23/481* (2013.01); *H01L 23/5283* (2013.01); *H01L 23/53223* (2013.01); *H01L 23/53238* (2013.01); *H01L 27/1463* (2013.01); *H01L 27/14614* (2013.01); *H01L 27/14634* (2013.01); *H01L 27/14636* (2013.01); *H01L 27/14643* (2013.01); *H01L 27/14687* (2013.01); *H01L 21/76831* (2013.01); *H01L 23/485* (2013.01)

(56) References Cited

U.S. PATENT DOCUMENTS

| | | | |
|---|---|---|---|
| 8,390,089 | B2 | 3/2013 | Chen et al. |
| 8,709,948 | B2 | 4/2014 | Danek et al. |
| 8,803,322 | B2 | 8/2014 | Yang et al. |
| 9,312,224 | B1* | 4/2016 | Canaperi ............ H01L 23/5329 |
| 2005/0085092 | A1* | 4/2005 | Adetutu ............ H01L 21/28202 438/763 |
| 2006/0045986 | A1 | 3/2006 | Hochberg et al. |
| 2006/0054934 | A1 | 3/2006 | Chen et al. |
| 2007/0232071 | A1 | 10/2007 | Balseanu et al. |
| 2008/0014741 | A1 | 1/2008 | Chen et al. |
| 2009/0263975 | A1 | 10/2009 | Kadonaga et al. |
| 2010/0044803 | A1 | 2/2010 | Chen et al. |
| 2010/0193883 | A1 | 8/2010 | Hase |
| 2011/0027979 | A1 | 2/2011 | Seino et al. |
| 2012/0103518 | A1 | 5/2012 | Kakimoto et al. |
| 2012/0190211 | A1 | 7/2012 | Ueda et al. |
| 2013/0009315 | A1* | 1/2013 | Colburn ............ H01L 23/5222 257/774 |
| 2013/0105996 | A1* | 5/2013 | Brink ................ H01L 21/76802 257/786 |
| 2013/0175697 | A1 | 7/2013 | Nguyen et al. |
| 2014/0120706 | A1 | 5/2014 | Chen et al. |
| 2014/0252521 | A1 | 9/2014 | Kao et al. |
| 2014/0273516 | A1 | 9/2014 | Xia et al. |
| 2015/0235963 | A1 | 8/2015 | Lin et al. |
| 2017/0179034 | A1 | 6/2017 | Canaperi et al. |

FOREIGN PATENT DOCUMENTS

| | | |
|---|---|---|
| CN | 101562133 A | 10/2009 |
| CN | 102239545 A | 11/2011 |
| CN | 102543795 A | 7/2012 |
| CN | 103339733 A | 10/2013 |
| CN | 103383937 A | 11/2013 |
| CN | 104409419 A | 3/2015 |
| CN | 104465506 A | 3/2015 |

\* cited by examiner

DIELECTRIC FILM FOR SEMICONDUCTOR FABRICATION

PRIORITY DATA

This application is a divisional of U.S. application Ser. No. 15/282,258, filed Sep. 30, 2016, which is herein incorporated by reference in its entirety.

BACKGROUND

Dielectric films are an essential element in semiconductor fabrication. For example, inter-layer dielectric (ILD) films are used in integrated circuits (IC) for embedding various metal vias and metal wires of the IC. For another example, dielectric films are used in deep trench isolation features in CMOS image sensors such as FSI (front-side illuminated) image sensors and BSI (back-side illuminated) image sensors. For yet another example, dielectric films are used as lining layers in through-silicon vias (TSV) in 3D (three-dimensional) IC packaging.

One main function of the dielectric films is to electrically insulate different metal features. For example, when fabricating an IC with high-k metal gate transistors, it is a typical practice to deposit a silicon oxide film (a dielectric film) over the metal gate and form metal vias and metal wires over the silicon oxide film. The silicon oxide film is supposed to insulate the metal gate from the metal vias and metal wires. However, one issue sometimes arises: the metal gate may react with certain chemistries during the deposition of the silicon oxide film, resulting in some metal compounds mixed in the finally deposited silicon oxide film. These metal compounds may lead to circuit shorts between the metal gate and the metal vias subsequently fabricated.

Accordingly, an improved dielectric film for semiconductor fabrication and methods of making the same are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
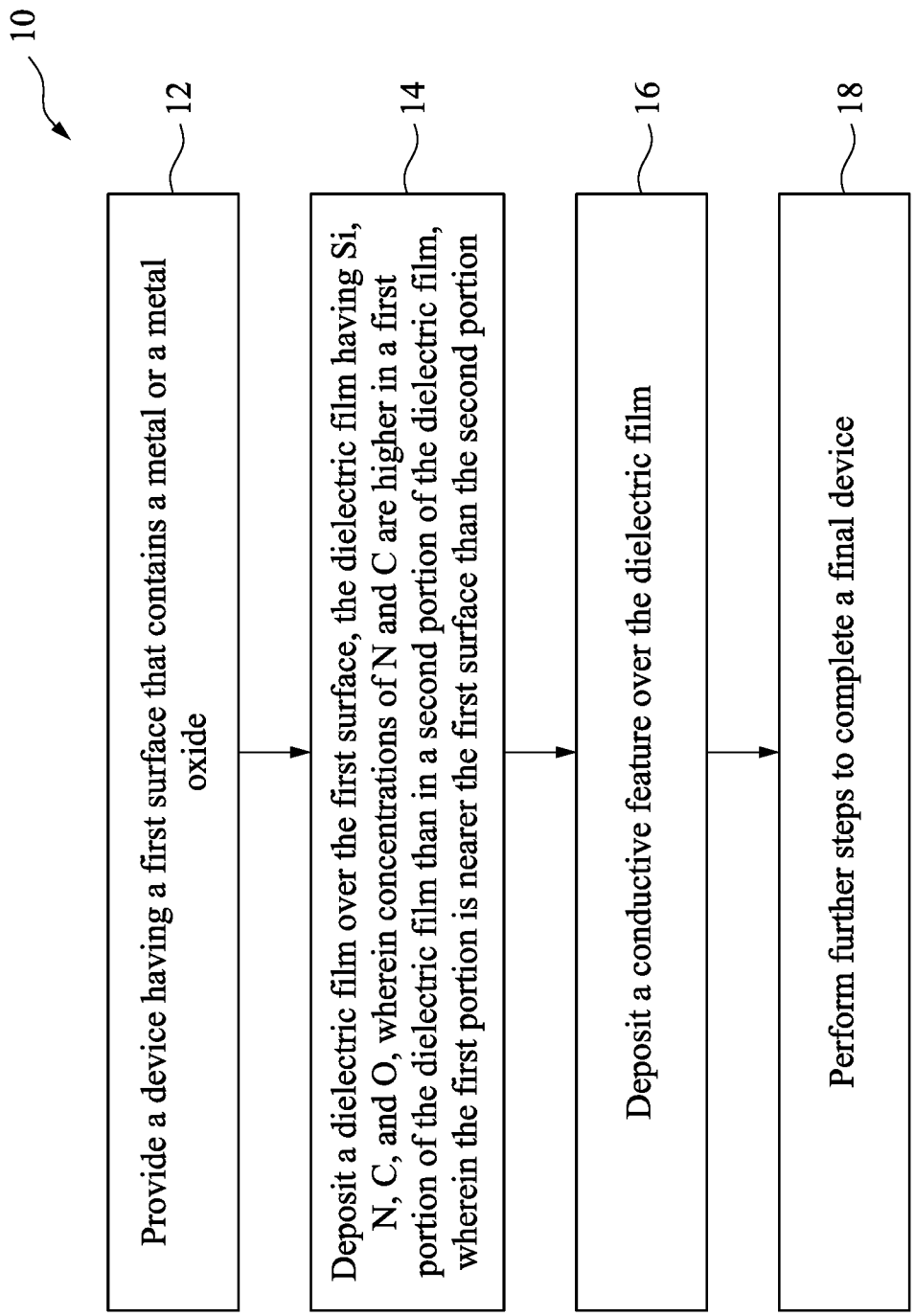
FIG. 1 is a flow chart of a method of fabricating a semiconductor device having an improved dielectric film according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to dielectric films for semiconductor fabrication, and more particularly to an improved dielectric film having Si, N, C, and O contents. In an embodiment, the improved dielectric film has a higher concentration of N and C in its lower portion than in its upper portion. This property helps electrically insulate metal elements (e.g., metal gates) underneath the dielectric film from metal elements (e.g., metal vias) that are above the dielectric film. The improved dielectric film may be deposited using, for example, low-temperature chemical vapor deposition (LT CVD) or atomic layer deposition. According to some embodiments of the provided subject matter, the precursors used for depositing the improved dielectric film do not (or insignificantly) react with the metal elements underneath. Therefore it reduces the likelihood of metal leakage sometimes seen with silicon oxide dielectric films. More detailed description of the improved dielectric film and the methods of making same are discussed below in conjunction with FIGS. 1-3C.

Referring to FIG. 1, shown therein is a flow chart of a method 10 of forming a semiconductor device 100 having an improved dielectric layer as an inter-layer dielectric (ILD) film between a transistor layer and a metal interconnect layer, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. The method 10 is described below in conjunction with FIGS. 2A, 2B, and 2C which are cross-sectional views of the semiconductor device 100 in various stages of a manufacturing process. Further, FIG. 2D illustrates the characteristics of the improved dielectric film in an embodiment. The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A, 2B, and 2C may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1, at operation 12, the method 10 receives (or, is provided with) a precursor of the device 100. For the convenience of discussion, the precursor of the device 100 is also referred to as the device 100. The device 100 has a surface through which a metal or a metal oxide is exposed. An improved dielectric film is to be deposited on the surface.

Figure 2A:
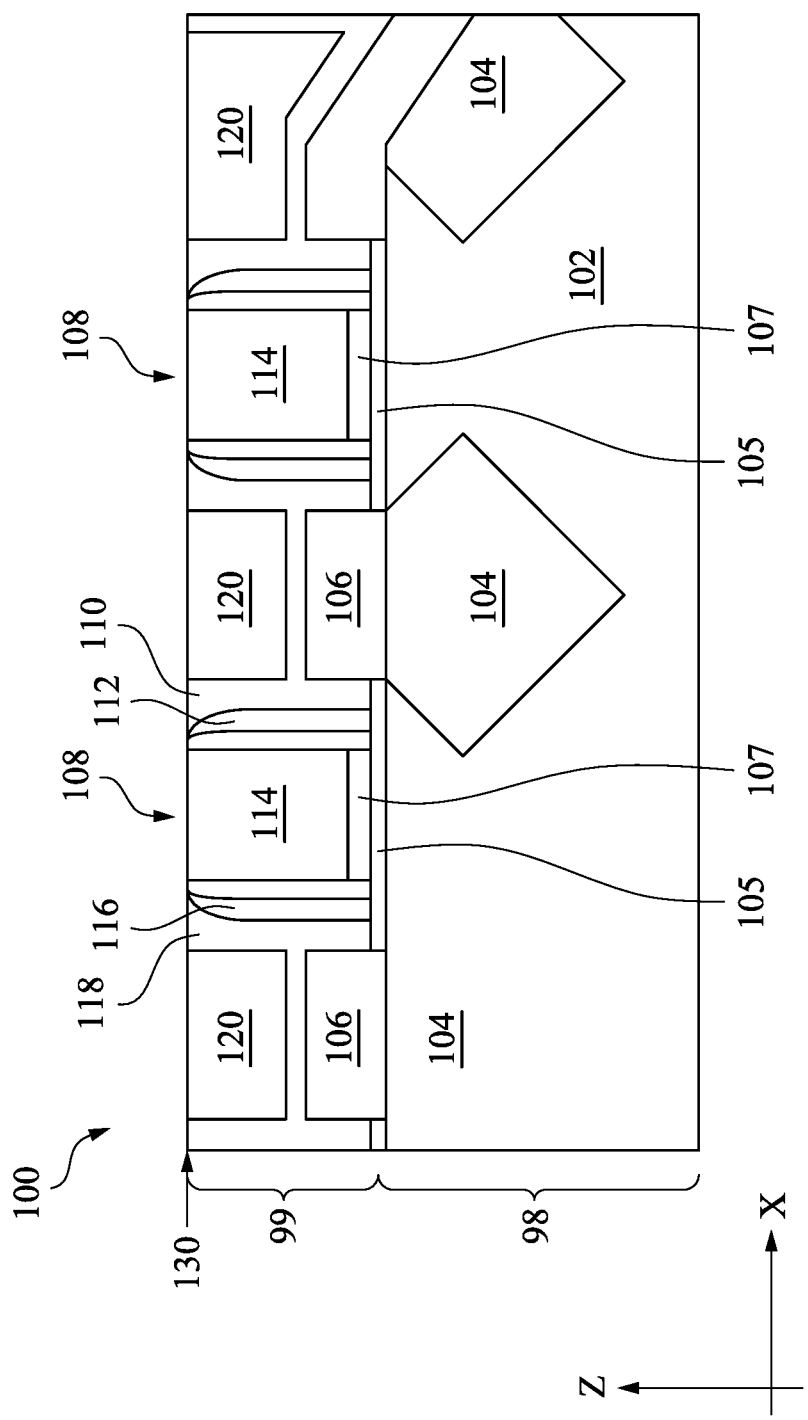
FIGS. 2A, 2B, and 2C illustrate cross-sectional views of a semiconductor device during some fabrication stages of the method of FIG. 1, in accordance with some embodiments.
Figure 2B:
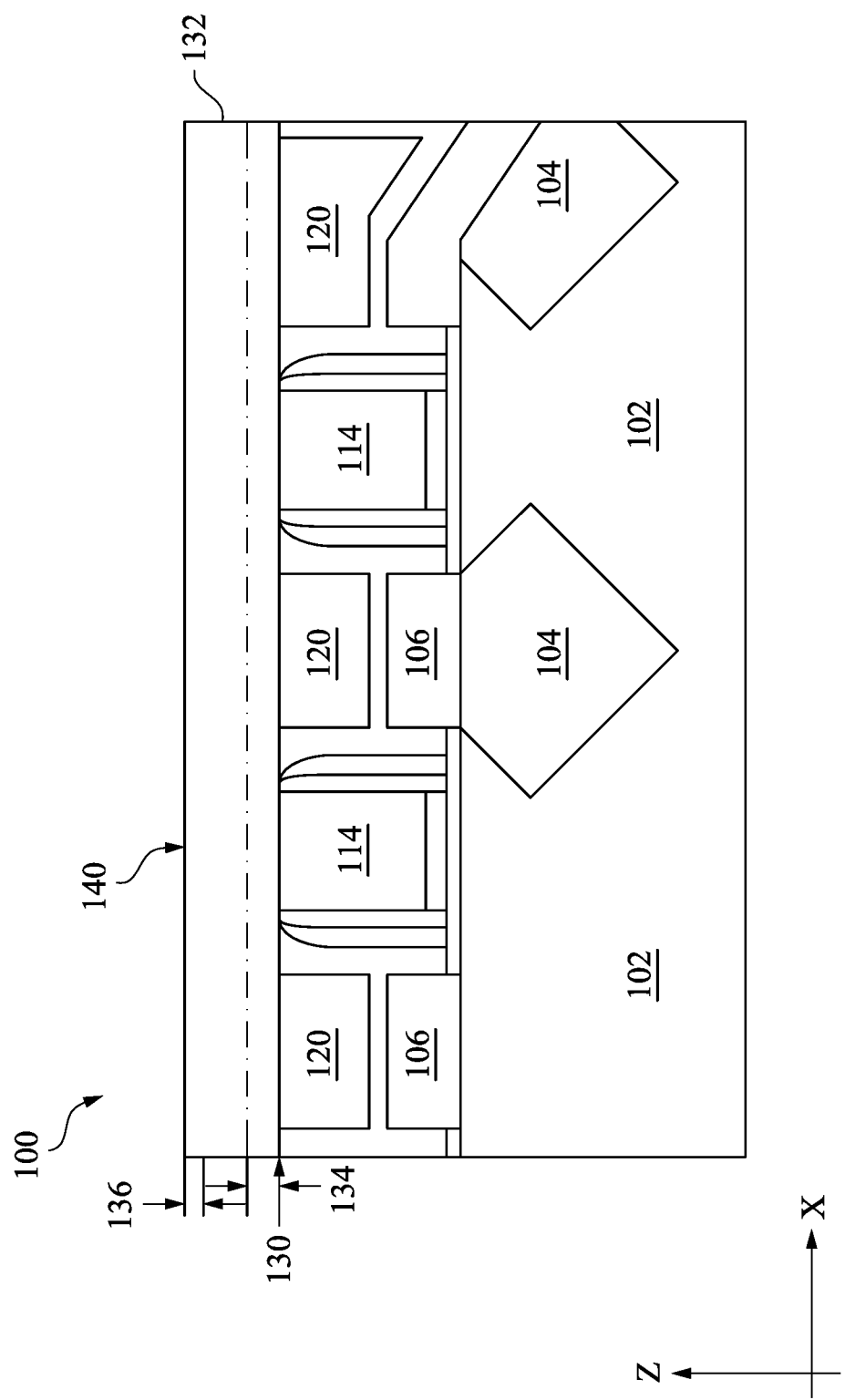
Figure 2C:
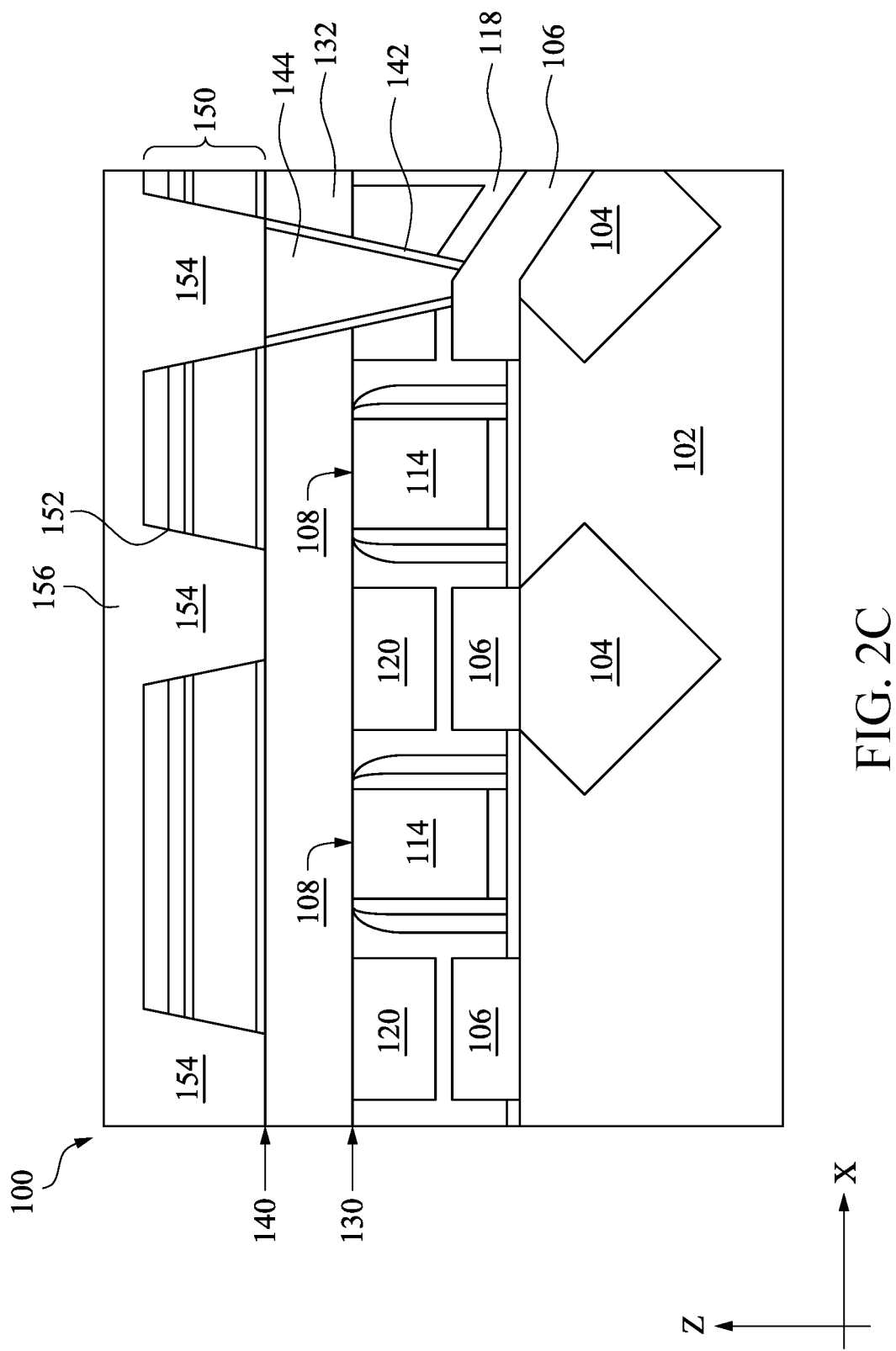
Figure 2D:
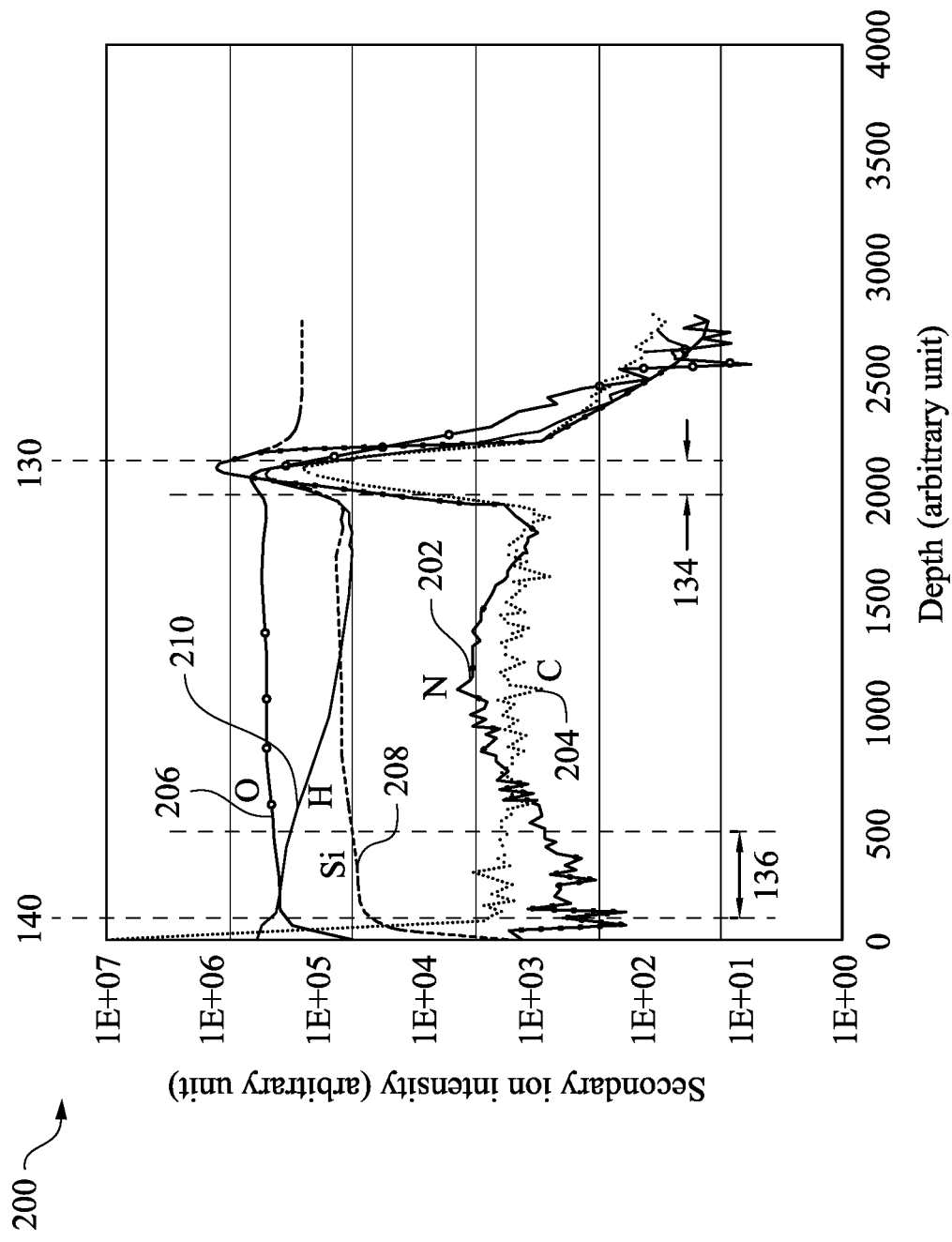
FIG. 2D illustrate contents of an improved dielectric film after a fabrication step of the method of FIG. 1, in accordance with some embodiments.

An embodiment of the device 100 is shown in FIG. 2A. Referring to FIG. 2A, the device 100 includes a semiconductor layer 98 and a gate layer 99. The semiconductor layer 98 includes a semiconductor substrate 102 and various features formed therein. The gate layer 99 includes silicide features 106, gate stacks 108, gate spacers 116, and various dielectric layers 118 and 120 that are formed on the semiconductor substrate 102. Various metal elements and/or metal oxides are exposed through a top surface 130 of the gate layer 130. The improved dielectric film according to the present disclosure is to be deposited on the surface 130.

Still referring to FIG. 2A, the substrate 102 includes various transistor source and drain (S/D) features 104 and transistor channels 105 between the S/D features 104. The gate stacks 108 are disposed over the transistor channels 105. The gate spacers 116 are disposed on sidewalls of each gate stack 108. The various dielectric layers include a contact etch stop (CES) layer 118 on sidewalls of the gate spacers 116 and on silicide features 106, and an inter-layer dielectric (ILD) layer 120 over the CES layer 118. The various features (or components) of the device 100 are further described below.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, include isolation regions, include doped regions, and/or include other suitable features and layers.

The S/D features 104 may include heavily doped S/D (HDD) (such as the S/D feature 104 on the left), lightly doped S/D (LDD), raised regions, strained regions, epitaxially grown regions (such as the two S/D features 104 on the right), and/or other suitable features. The S/D features 104 may be formed by etching and epitaxial growth, halo implantation, S/D implantation, S/D activation, and/or other suitable processes. The silicide features 106 are formed directly over the S/D features 104 for reducing S/D contact resistance and may include self-aligned silicidation (salicidation). For example, the silicide features 106 may be formed by a process that includes depositing a metal layer, annealing the metal layer such that the metal layer is able to react with semiconductor material in the S/D features 104 to form silicide or germane-silicidation, and then removing the non-reacted metal layer. The transistor channels 105 are sandwiched between a pair of S/D features 104. The transistor channels 105 conduct currents between the respective S/D features 104 when the semiconductor device 100 is in use. In an embodiment, the substrate 102 includes fin-like active regions for forming multi-gate FETs such as FinFETs. To further this embodiment, the S/D features 104 and the transistor channels 105 are formed in or on the fins.

The gate stacks 108 are disposed over the transistor channels 105. Each gate stack 108 is a multi-layer structure. In an embodiment, the gate stack 108 includes an interfacial layer 107, a gate dielectric layer 110, a work function metal layer 112, a metal fill layer 114, and other layers (not labeled). The interfacial layer 107 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate dielectric layer 110 may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function metal layer 112 may be a p-type or an n-type work function layer. The p-type work function layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The work function metal layer 112 may include a plurality of layers and may be deposited by CVD, PVD, and/or other suitable process. The metal fill layer 114 may include aluminum (Al), tungsten (W), cobalt (Co), copper (Cu), and/or other suitable materials. The metal fill layer 114 may be formed by CVD, PVD, plating, and/or other suitable processes. The gate stacks 108 may be formed in a gate-first process or a gate-last process (i.e., a replacement gate process).

The gate spacers 116 may be a single layer or multi-layer structure disposed on sidewalls of the gate stacks 108. In an embodiment, the spacers 116 include a low-k (e.g., k<3.9) dielectric material. In some embodiments, the gate spacers 116 include a dielectric material, such as silicon oxide ($SiO_2$), silicon nitride (SiN), silicon oxynitride (SiON), other dielectric material, or combination thereof. In an example, the gate spacers 116 is formed by blanket depositing a first dielectric layer (e.g., a $SiO_2$ layer having a uniform thickness) as a liner layer over the device 100 and a second dielectric layer (e.g., a SiN layer) as a main D-shaped spacer over the first dielectric layer, and then, anisotropically etching to remove portions of the dielectric layers to form the gate spacers 116.

The CES layer 118 may include a dielectric material such as silicon nitride (SiN), silicon oxide ($SiO_2$), silicon oxynitride (SiON), and/or other materials. The CES layer 118 may be formed by plasma enhanced CVD (PECVD) process and/or other suitable deposition or oxidation processes. The ILD layer 120 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 120 may be deposited by a PECVD process, a flowable CVD (FCVD) process, or other suitable deposition technique.

In an embodiment, the CES layer 118 is deposited over the substrate 102 covering various structures thereon, and the ILD layer 120 is deposited over the CES layer 118. Subsequently, a chemical mechanical polishing (CMP) process is performed to planarize and partially remove the ILD layer 120 and the CES layer 118, producing a planar top surface 130, which includes top surfaces of the gate stacks 108. Particularly, one or more metal elements and/or one or more metal oxides are exposed through the surface 130. For example, the metal fill layer 114 is exposed at the surface 130 and may include Al, W, Co, Cu, and/or other suitable metal materials.

In some fabrication processes, a silicon oxide film is formed over the surface 130, and metal vias and metal wires are subsequently formed in or on the silicon oxide film. For example, the silicon oxide film may be formed by reducing silane ($SiH_4$) with oxygen using a chemical vapor deposition (CVD) method. An issue sometimes arises with such fabrication processes—the metal elements exposed at the surface 130 may react with silicon radicals during the deposition, thereby forming Si-Metal alloys. Such reaction may be explained as follows:

$$SiH_4 + O_2 + Metal \rightarrow SiO_2 + SiOH + H_2O + Si\text{-Metal} \quad (1)$$

The Si-Metal alloy may be randomly distributed in the $SiO_2$ film, and may include aluminum silicon alloy, copper silicon alloy, or other metal silicon alloys, depending on the metal elements in the metal fill layer 114 as well as in other IC features exposed at the surface 130. When metal vias (such as the metal vias 154 on FIG. 2C) are formed over this silicon oxide film, the Si-Metal alloy would become a leakage path between the metal vias and the metal gates 108, causing circuit shorts or other types of defects. The provided subject matter resolves such issue by depositing an improved dielectric film 132 over the surface 130. The improved dielectric film 132 contains Si, N, C, and O without Si-Metal alloy(s) therein. This is discussed in conjunction with FIGS. 2B and 2D.

At operation 14, the method 10 (FIG. 1) deposits the improved dielectric film 132 over the surface 130. Referring to FIG. 2B, the dielectric film 132 is deposited directly on the surface 130 in the present embodiment. In an embodiment, the operation 14 includes a low-temperature chemical vapor deposition (LT CVD) process that uses oxygen and an organic compound as precursors, the organic compound having silicon and nitrogen. As one example, the organic compound is BTBAS (bis(tertiarybutylamino)silane). The inventors of the provided subject matter have found that reducing BTBAS with oxygen in a low temperature environment does not produce metal silicon alloy in the dielectric film 132. While the mechanism of the reaction does not affect the scope of the claims, it is believed that, in some embodiments, the following reaction may be dominant in the LT CVD process with BTBAS and oxygen:

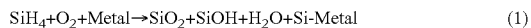

$$\quad (2)$$

In the above reaction (2), Si radicals do not react with the Metal. Therefore, no Si-Metal alloy is produced. Further, the dielectric film 132 has a unique property that it contains higher concentrations of N and/or C at a lower portion 134 of the dielectric film 132 than in an upper portion 136. As used herein, the lower portion 134 refers to a portion of the dielectric film 132 that is near the surface 130, while the upper portion 136 refers to another portion of the dielectric film 132 that is away from the surface 130. This property is further shown in FIG. 2D using measurements of the O, Si, H, N, and C contents in the dielectric film 132, in accordance with an embodiment.

Referring to FIG. 2D, a graph 200 shows the relative concentrations of the O, Si, H, N, and C contents in the dielectric film 132, as a function of the depth of the dielectric film 132 between a top surface 140 of the dielectric film 132 and the surface 130 along the Z axis (FIG. 2B). The top surface 140 may be provided as a planar surface by a CMP process. Particularly, the curve 202 shows the N content in the dielectric film 132, the curve 204 the C content, the curve 206 the O content, the curve 208 the Si content, and the curve 210 the H content. As shown in FIG. 2D, the concentrations of N and C contents are much higher in the lower portion 134 than in the upper portion 136. In the present embodiment, each of the concentrations of N and C is at least 10 times higher in the lower portion 134 than in the upper portion 136. The N and C contents may be present in the form of SiCON, SiCN, and/or SiC. Effectively, the lower portion 134 is a layer of silicon carbide and/or silicon carbide nitride. This layer of silicon carbide and/or silicon carbide nitride functions as a protection layer over the surface 130, which prevents the metal elements of the surface 130 from reacting with silicon radicals during the LT CVD process. In contrast, silicon oxide is the dominant content in the upper portion 136 of the dielectric film 132.

In embodiments, the LT CVD process of the operation 14 is performed at a temperature below the melting point of the metal elements in the surface 130. For example, the LT CVD process may be performed at a temperature ranging from 300 to 400 degrees Celsius which is below the melting points of aluminum (660.3° C.) and copper (1,085° C.). When the metal fill layer 114 uses Co or W (whose melting points are 1,495° C. and 3,422° C. respectively), a higher temperature may be used for the CVD process. Further, the LT CVD process may use other organic compounds having silicon and nitrogen in addition to, or in place of, BTBAS. For example, the LT CVD process may use other amino silane such as BDEAS (bis(diethylamino)silane) and TIPAS (tris(isopropylamino)silane). For another example, the organic compound may be BDEAES (bis(diethylamino) ethylsilane) or TEAS (tris(ethylamino)silane). The organic compounds BTBAS, BDEAS, TIPAS, BDEAES, and TEAS have the following structural chemical formula:

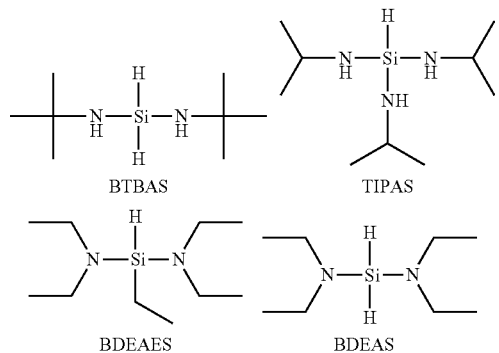

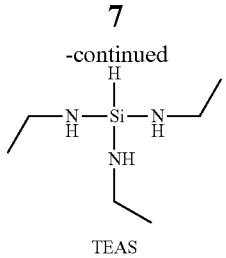

TEAS

Still further, the operation 14 may use an atomic layer deposition (ALD) process to form the dielectric film 132. The ALD process use oxygen and an organic compound having silicon and nitrogen as precursors and is performed at a temperature below the melting point of the metal elements in the surface 130. The organic compound may be one of BTBAS, BDEAS, TIPAS, BDEAES, TEAS, and other suitable organic compounds.

At operation 16, the method 10 (FIG. 1) forms one or more conductive features over the dielectric film 132. Referring to FIG. 2C, the conductive features may include an S/D contact 144 or a gate contact (not shown) that penetrate the dielectric film 132. Additionally, the conductive features include metal vias 154 and metal wires 156 that are deposited over the dielectric film 132. In these embodiments, the dielectric film 132 electrically insulates the one or more conductive features from the metal gates 108 except when a gate contact is purposely connected to the metal gates 108. More details of the operation 16 are discussed below.

In an embodiment, the process of forming the S/D contact 144 includes forming a contact hole through the dielectric film 132, the ILD layer 120, and the CES layer 118, thereby exposing the silicide feature 106. The contact hole may be formed using a photolithography process and an etching process. Subsequently, a barrier layer 142 is deposited on sidewalls of the contact hole and the S/D contact 144 is deposited in the contact hole over the barrier layer 142. The S/D contact 144 may use a metal such as aluminum (Al), tungsten (W), copper (Cu), cobalt (Co), combinations thereof, or other suitable metal; and can be deposited using a suitable process, such as CVD, PVD, plating, and/or other suitable processes. A CMP process may be performed to planarize the top surface of the device 100 after the S/D contact 144 has been deposited. In this embodiment, the dielectric film 132 and the barrier layer 142 collectively prevent metal leakage between the S/D contact 144 and the metal elements of the metal gates 108.

In an embodiment, the process of forming the metal vias 154 and the metal wires 156 includes depositing one or more dielectric layers 150 over the dielectric film 132. The one or more dielectric layer 150 may include low-k dielectric material(s), extreme low-k dielectric material(s), nitrogen-free anti-reflective material(s), and other suitable dielectric materials. Then, single damascene or dual damascene process is used for forming the metal vias 154 and the metal wires 156 that are embedded in the dielectric layers 150. In one example, via holes and wire trenches are formed in the dielectric layers 150 by one or more photolithography processes and etching processes. A metal barrier layer 152, such as TiN, is formed on sidewalls of the via holes and the wire trenches. Subsequently, a metal such as aluminum (Al), tungsten (W), copper (Cu), cobalt (Co), combinations thereof, or other suitable metal is deposited into the via holes and the wire trenches over the barrier layer 152, thereby forming the metal vias 154 and the metal wires 156. A CMP process may be performed to remove the metal material outside of the wire trenches. The dielectric film 132 effectively insulates the metal vias 154 from the metal fill layer 114 of the metal gates 108.

At operation 18, the method 10 performs further operations to complete the fabrication of the device 100. For example, the method 10 may form additional layers of an interconnect structure over the metal wires 156.

Figure 3A:
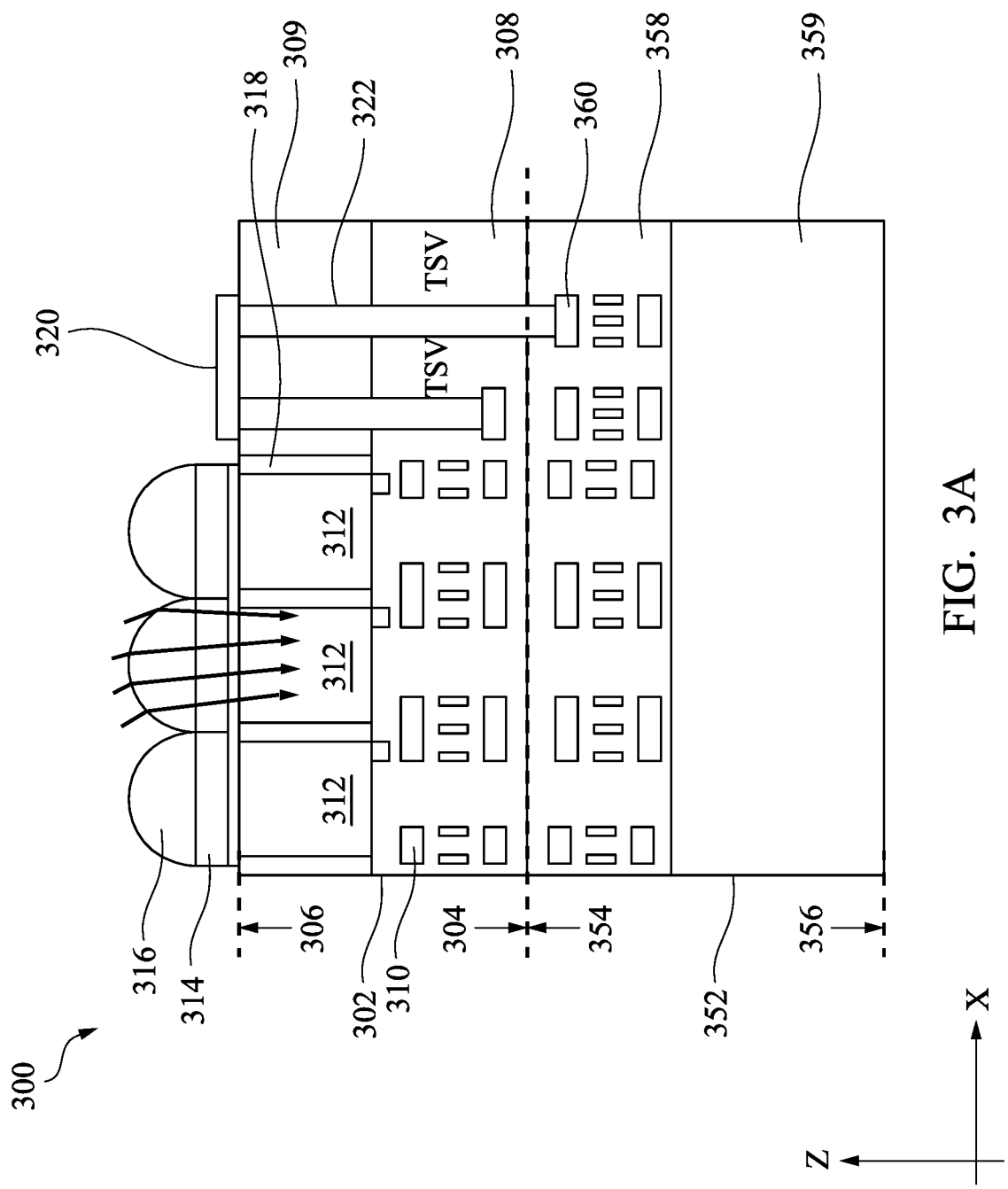
FIG. 3A illustrates another semiconductor device having an improved dielectric film according to one or more embodiments of the present disclosure.
Figures 3B, 3C:
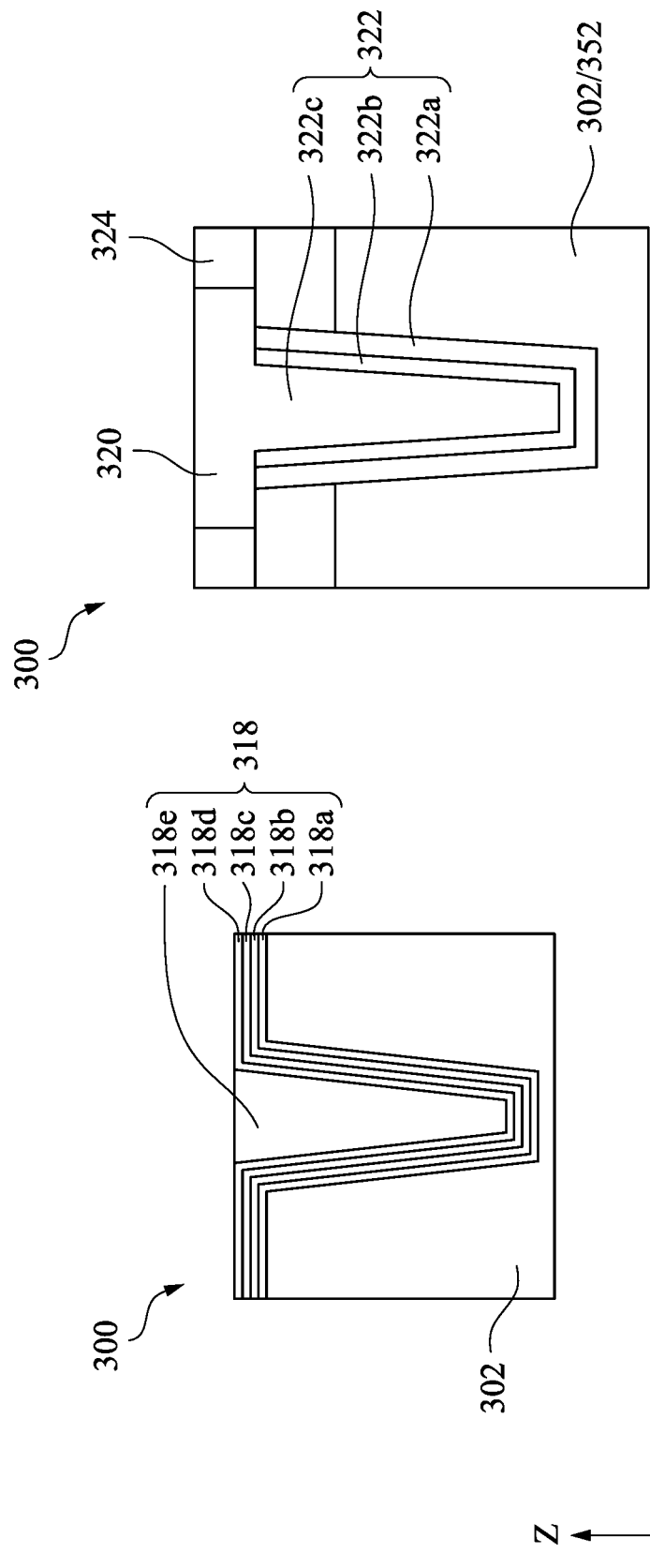
FIGS. 3B and 3C are enlarged fragmentary view of certain features of the device of FIG. 3A.

FIGS. 3A, 3B, and 3C illustrate another embodiment of semiconductor devices that benefit from the improved dielectric film of the present disclosure. Referring to FIG. 3A, shown therein is a 3D stacked BSI image sensor 300 in accordance with an embodiment. The image sensor 300 includes a first substrate (e.g., a semiconductor wafer) 302 and a second substrate 352 (e.g., another semiconductor wafer) that are bonded together through wafer-level bonding. Each of the substrates 302 and 352 may include an elementary semiconductor such as silicon or germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. The first substrate 302 has a first (front) side 304 and a second (back) side 306. The second substrate 352 has a first (front) side 354 and a second (back) side 356. The two front sides 304 and 354 are bonded together using a metal bonding, a direct bonding, a hybrid bonding, or other bonding methods. The substrate 302 includes metal wires 310 in a first portion 308. In a second portion 309, the substrate 302 includes photo-sensitive elements (e.g., photodiodes) 312 that are isolated from each other by deep trench isolation (DTI) features 318. The image sensor 300 further includes color filters 314 and micro lenses 316 that are disposed over the back side 306. Radiation incident upon the image sensor 300 will form images in the photo-sensitive elements 312. Isolation by the DTI features 318 improves the sensitivity and the resolution of the image sensor 300. The improved dielectric film of the present disclosure may be used as a lining layer in the DTI features 318.

Still referring to FIG. 3A, the substrate 352 includes metal wires 360 in a first portion 358. In a second portion 359, the substrate 352 may also include photo-sensitive elements (not shown), for example, to make the image sensor 300 a dual-facing image sensor. The image sensor 300 further includes conductive features 320 and through-silicon vias (TSVs) 322 that interconnect the metal wires 310 and 360 for integrating the functionalities of the substrates 302 and 352. The improved dielectric film of the present disclosure may be used as a lining layer in the TSVs 322. In another embodiment, the substrates 302 and 352 may be interconnected using metal direct bonding at the interface of 304/354 instead of using TSVs 322.

Referring to FIG. 3B, shown therein is an enlarged diagrammatic view of the image sensor 300, showing a more detailed view of the DTI 318, in accordance with an embodiment. The DTI 318 includes multiple layers embedded in the substrate 302. For example, the DTI 318 includes an adhesion layer 318a on bottom and side walls of a deep trench etched in the substrate 302, one or more negative charge accumulation layers 318b over the adhesion layer 318a, an improved dielectric layer 318c over the layers 318b, a metal barrier layer 318d (e.g., TiN) over the layer 318c, and a metal layer 318e over the metal barrier layer 318d. In an embodiment, the layer 318b includes a metal oxide such as tantalum pentoxide ($Ta_2O_5$), and the metal layer 318e includes W, Al, Cu, Co, or other suitable metals. To further this embodiment, the improved dielectric layer 318c is deposited over the layer 318b using a CVD or ALD method where oxygen and an organic compound having silicon and nitrogen are precursors. The organic compound may be one of BTBAS, BDEAS, TIPAS, BDEAES, TEAS, and other suitable organic compounds. The improved dielectric layer 318c contains Si, N, C, and O without a Si-Metal alloy therein. Furthermore, the layer 318c contains higher concentrations of N and/or C at a lower portion thereof than in an upper portion thereof, as discussed above with respect to the dielectric film 132. As used herein, the lower portion refers to a portion of the dielectric layer 318c that is near the layer 318b, while the upper portion refers to another portion of the dielectric layer 318c that is away from the layer 318b. The dielectric layer 318c effectively insulates the metal elements in the layers 318d and 318e from the metal elements in the layer 318b.

Referring to FIG. 3C, shown therein is an enlarged diagrammatic view of the image sensor 300, showing a more detailed view of the TSV 322, in accordance with an embodiment. The TSV 322 electrically contacts the conductive feature 320 which is embedded in a dielectric layer 324. The TSV 322 includes multiple layers embedded in the substrates 302/352. For example, the TSV 322 includes a first dielectric layer 322a deposited onto at least sidewalls of a trench etched into the substrates 302 and 352, a metal barrier layer 322b over the first dielectric layer 322a, and a metal layer 322c over the metal barrier layer 322b. The metal barrier layer 322b may contain TiN in an embodiment. The metal layer 322c may contain W, Al, Cu, Co, or other suitable metals. In an embodiment, the image sensor 300 includes a metal oxide layer (not shown) between the first dielectric layer 322a and the substrates 302/352. The first dielectric layer 322a is deposited using a CVD or ALD method where oxygen and an organic compound having silicon and nitrogen are precursors. The organic compound may be one of BTBAS, BDEAS, TIPAS, BDEAES, TEAS, and other suitable organic compounds. The improved dielectric layer 322a contains Si, N, C, and O without a Si-Metal alloy therein. Furthermore, the layer 322a contains higher concentrations of N and/or C at a lower portion thereof than in an upper portion thereof, as discussed above with respect to the dielectric films 132 and 318c. The first dielectric layer 322a effectively insulates the metal elements in the layers 322b and 322c from the substrates 302/352 as well as from any metal oxide layer underneath the first dielectric layer 322a.

Although not intended to be limiting, one or more embodiments of the present disclosure provide many benefits to semiconductor fabrication. For example, an improved dielectric film according to the present disclosure provides effective electrical insulation between metal elements such as metal gates and metal vias. The methods of depositing the improved dielectric film do not produce silicon metal alloy, which effectively prevents metal leakage and metal diffusion. As high-k metal gates become popular in advanced semiconductor fabrication, this improved dielectric film provides an effective solution to the problem of metal gate shorting defects and metal diffusion through thin dielectric films. Further, the provided methods can be easily integrated into existing semiconductor process flows.

In one exemplary aspect, the present disclosure is directed to a method for semiconductor manufacturing. The method includes receiving a device having a first surface through which a first metal or an oxide of the first metal is exposed. The method further includes depositing a dielectric film having Si, N, C, and O over the first surface such that the dielectric film has a higher concentration of N and C in a first portion of the dielectric film near the first surface than in a second portion of the dielectric film further away from the first surface than the first portion. The method further includes forming a conductive feature over the dielectric film.

In another exemplary aspect, the present disclosure is directed to a method for semiconductor manufacturing. The method includes receiving a device having a first surface through which a semiconductor material or a first metal of the device is exposed. The method further includes depositing a dielectric film having Si, N, C, and O over the first surface by a low temperature chemical vapor deposition (LT CVD) process such that the dielectric film has a higher concentration of C and N in a first portion of the dielectric film near the first surface than in a second portion of the dielectric film away from the first surface. The method further includes depositing a second metal over the dielectric film.

In yet another exemplary aspect, the present disclosure is directed to a semiconductor device. The semiconductor device includes a first layer having a first surface through which a first metal or an oxide of the first metal is exposed. The semiconductor device further includes a dielectric film directly over the first surface, wherein the dielectric film includes Si, N, C, and O, and has a higher concentration of C and N in a first portion of the dielectric film near the first surface than in a second portion of the dielectric film further away from the first surface than the first portion. The semiconductor device further includes a conductive feature over the dielectric film.

In an embodiment of the semiconductor device, the concentration of C in the first portion of the dielectric film is at least 10 times more than that in the second portion of the dielectric film. In another embodiment of the semiconductor device, the concentration of N in the first portion of the dielectric film is at least 10 times more than that in the second portion of the dielectric film. In yet another embodiment of the semiconductor device, each of the concentrations of C and N in the first portion of the dielectric film is at least 10 times more than that in the second portion of the dielectric film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising: a substrate; a first source/drain region and a second source/drain region of a transistor formed in the substrate; a metal-containing gate structure disposed over the substrate, wherein the first source/drain region and the second source/drain region are disposed on opposite sides of the metal-containing gate structure; a dielectric layer disposed over the metal-containing gate structure; wherein: the dielectric layer includes a first portion having a first concentration of nitrogen or carbon and a second portion having a second concentration of nitrogen or carbon; both the first portion and the second portion of the dielectric layer contain nitrogen, carbon, and hydrogen; the first concentration is greater than the second concentration; and the substrate is located closer to the first portion than to the second portion.

2. The semiconductor device of claim 1, wherein the metal-containing gate structure includes a metal-containing gate electrode.

3. The semiconductor device of claim 2, wherein the dielectric layer is in direct contact with an upper surface of the metal-containing gate electrode.

4. The semiconductor device of claim 1, wherein the metal-containing gate structure includes a negative charge accumulation layer or an adhesion layer.

5. The semiconductor device of claim 1, further comprising: a metal-containing layer disposed over the dielectric layer.

6. The semiconductor device of claim 5, wherein the metal-containing layer includes a metal wire or a via of an interconnect structure.

7. The semiconductor device of claim 6, wherein the via is a through-silicon via (TSV) of an image sensor device.

8. The semiconductor device of claim 1, wherein the dielectric layer is free of silicon-metal alloys.

9. The semiconductor device of claim 1, wherein the first concentration is at least 10 times greater than the second concentration.

10. A semiconductor device, comprising: a substrate; a first source/drain region and a second source/drain region of a transistor formed in the substrate; a first metal-containing structure located over the substrate, wherein the first metal-containing structure includes a metal gate electrode of the transistor, and wherein the first source/drain region and the second source/drain region are disposed on opposite sides of the metal gate electrode; a dielectric layer located over the first metal-containing structure, wherein the dielectric layer contains nitrogen, and wherein a concentration of the nitrogen inside the dielectric layer varies as a function of a distance from the first metal-containing structure; and a second metal-containing structure disposed over the dielectric layer.

11. The semiconductor device of claim 10, wherein the concentration of the nitrogen reaches a peak near an interface between the dielectric layer and the first metal-containing structure.

12. The semiconductor device of claim 10, wherein the dielectric layer further contains carbon, silicon, and oxygen.

13. The semiconductor device of claim 12, wherein the dielectric layer is free of a silicon metal alloy.

14. The semiconductor device of claim 10, wherein:
the first metal-containing structure includes a gate dielectric disposed below the metal gate electrode; and
the second metal-containing structure includes a metal wire or a via of an interconnect structure.

15. A semiconductor device, comprising: a substrate; a first source/drain region and a second source/drain region of a transistor formed in the substrate; a metal gate electrode of the transistor located over the substrate, wherein the first source/drain region and the second source/drain region are disposed on opposite sides of the metal gate electrode; a single dielectric film disposed directly over an upper surface of the metal gate electrode, wherein the single dielectric film includes Si, N, C, and 0, and has a higher concentration of C and N in a first portion of the single dielectric film near the upper surface of the metal gate electrode than in a second portion of the single dielectric film farther away from the upper surface of the metal gate electrode than the first portion, and wherein both the first portion and the second portion of the single dielectric film contains hydrogen; and a conductive feature disposed over the single dielectric film.

16. The semiconductor device of claim 15, wherein the concentration of C in the first portion of the single dielectric film is at least 10 times more than that in the second portion of the single dielectric film.

17. The semiconductor device of claim 15, wherein the concentration of N in the first portion of the single dielectric film is at least 10 times more than that in the second portion of the single dielectric film.

18. The semiconductor device of claim 15, wherein each of the concentrations of C and N in the first portion of the single dielectric film is at least 10 times more than that in the second portion of the single dielectric film.

19. The semiconductor device of claim 15, wherein the conductive feature includes a metal via or a metal wire.

* * * * *